(12) United States Patent
Leobandung et al.

(10) Patent No.: US 11,031,346 B2
(45) Date of Patent: Jun. 8, 2021

(54) ADVANCED WAFER SECURITY METHOD INCLUDING PATTERN AND WAFER VERIFICATIONS

(71) Applicant: International Business Machines Corporation, Armonk, NY (US)

(72) Inventors: Effendi Leobandung, Stormville, NY (US); Carol Boye, Latham, NY (US); Fee Li Lie, Albany, NY (US); Shravan Kumar Matham, Guilderland, NY (US); Brad Austin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/412,648

(22) Filed: May 15, 2019

(65) Prior Publication Data
US 2020/0365518 A1    Nov. 19, 2020

(51) Int. Cl.
*H01L 23/544* (2006.01)
*H01L 21/66* (2006.01)

(52) U.S. Cl.
CPC ............ *H01L 23/544* (2013.01); *H01L 22/20* (2013.01); *H01L 2223/54433* (2013.01)

(58) Field of Classification Search
CPC .............. H01L 23/544; H01L 22/20; H01L 2223/54433
USPC .......................................................... 257/48
See application file for complete search history.

(56) References Cited

U.S. PATENT DOCUMENTS

| | | | |
|---|---|---|---|
| 5,890,807 A | * | 4/1999 | Igel .................. H01L 23/544 257/E23.179 |
| 8,525,169 B1 | | 9/2013 | Edelstein et al. |
| 9,202,040 B2 | | 12/2015 | Rosenblatt et al. |
| 9,897,560 B2 | | 2/2018 | Martin et al. |
| 10,132,858 B2 | | 11/2018 | Vanhoucke et al. |
| 2002/0024453 A1 | * | 2/2002 | Maeda .................. H01L 23/57 341/50 |
| 2002/0126889 A1 | | 9/2002 | Pikler et al. |
| 2006/0187719 A1 | | 8/2006 | Matsumoto et al. |
| 2008/0237506 A1 | | 10/2008 | Ophey et al. |
| 2009/0099830 A1 | * | 4/2009 | Gross ................ G01R 31/2813 703/14 |
| 2012/0124385 A1 | * | 5/2012 | Klasen ................ H04L 9/3236 713/179 |
| 2012/0140292 A1 | | 6/2012 | Gerigk et al. |
| 2015/0117701 A1 | * | 4/2015 | Ross ...................... G06K 9/3216 382/100 |

(Continued)

*Primary Examiner* — Dzung Tran
(74) *Attorney, Agent, or Firm* — Scully, Scott, Murphy & Presser, P.C.; L. Jeffrey Kelly, Esq.

(57) ABSTRACT

An advanced security method for verifying that integrated circuit patterns being processed into one or more layers provided to a wafer are trusted patterns and that the wafer being used during processing is a trusted wafer is provided. The method includes separate steps of pattern verification and wafer verification. Notably, the method includes first verifying that a pattern printed on a wafer matches a pattern of a trusted reference. Next, a peak and valley profile present at a specific location on a backside surface of the wafer is measured. The method further includes second verify that the measured peak and valley profile matches an original peak and valley profile measured at the same location on the backside surface of the wafer.

19 Claims, 4 Drawing Sheets

(56) References Cited

U.S. PATENT DOCUMENTS

2018/0101945 A1   4/2018   Stone et al.

* cited by examiner

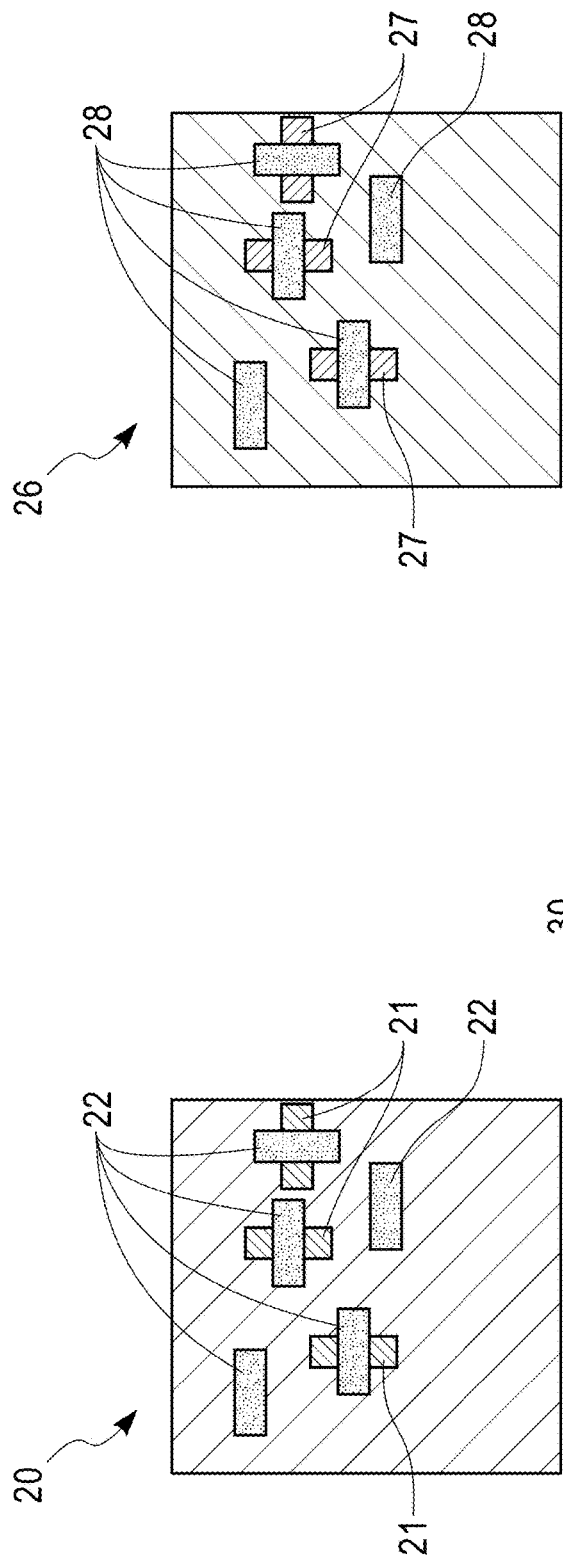
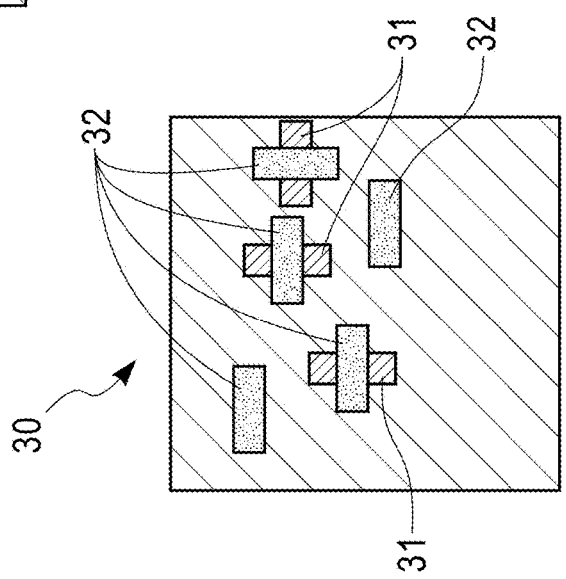
FIG. 3A
FIG. 3B
FIG. 3C

ADVANCED WAFER SECURITY METHOD
INCLUDING PATTERN AND WAFER
VERIFICATIONS

BACKGROUND

The present application relates to integrated circuit devices, and more specifically, to a method and structure to protect integrated circuits used in semiconductor devices.

Circuit counterfeiting is a major loss of revenue and reputation for integrated circuit manufacturers. A circuit design can be stolen by reverse engineering or other means such as access to mask sets and hacking into design databases. The stolen circuit design is then manufactured at a lower quality foundry and parts are sold as if produced by the original integrated circuit manufacturer. Lower grade parts are used in critical electronic systems and cause dramatic failures. Insertion of malicious circuits is also a problem that could prevent the chip from functioning correctly. It has been estimated that one percent of semiconductor devices are counterfeit units. With the move to IoT devices, with less complexity in integrated circuits, circuit counterfeiting is projected to become a greater problem.

There has been recognition of the problem. The solutions to date have mostly been limited to the use of security markings, e.g., using special security ink on packages. With a special security ink, the manufacturer will print some data such as a numeral, bar code or other marking. Typically, the markings will include data such as part number, serial number, data codes and logos. Various ink options are available such as visible fluorescent inks, invisible fluorescent inks, UV invisible inks, IR invisible inks or UV long/short wave inks. A problem, however, is that the printed data and ink are not unique and it is relatively easy to identify and reproduce a naming scheme or bar code identification. Those engaged in counterfeiting devices are becoming more skilled and well financed, and can gain access to the requisite ink and data for counterfeiting purposes.

SUMMARY

The present application provides an advanced security method for verifying that integrated circuit patterns being processed into one or more layers provided to a wafer are trusted patterns and that the wafer being used during processing is a trusted wafer. The method includes separate steps of pattern verification and wafer verification. In one embodiment, the method includes first verifying that a pattern printed on a wafer matches a pattern of a trusted reference. Next, a peak and valley profile present at a specific location on a backside surface of the wafer is measured. The method further includes second verify that the measured peak and valley profile matches an original peak and valley profile measured at the same location on the backside surface of the wafer.

The present application also provides a structure that has an unclonable ID inserted on the backside of the wafer which can be used to determine that the wafer being used is a trusted or non-trusted wafer. In one embodiment, the structure includes a wafer having a backside surface containing at least one intentionally added physical unclonable feature (PUF) located at specific location, wherein the at least one intentionally added physical unclonable feature is a peak and valley profile of the specific location.

BRIEF DESCRIPTION OF THE DRAWINGS

FIG. 3A is an illustration of a design pattern that can be used in another embodiment of the present application.

FIG. 3B is a simulated image using the design data provided by the design pattern of FIG. 3A.

FIG. 3C is an illustration of a wafer that has printed patterns located in more than layer provided to the wafer.

DETAILED DESCRIPTION

Figure 1:
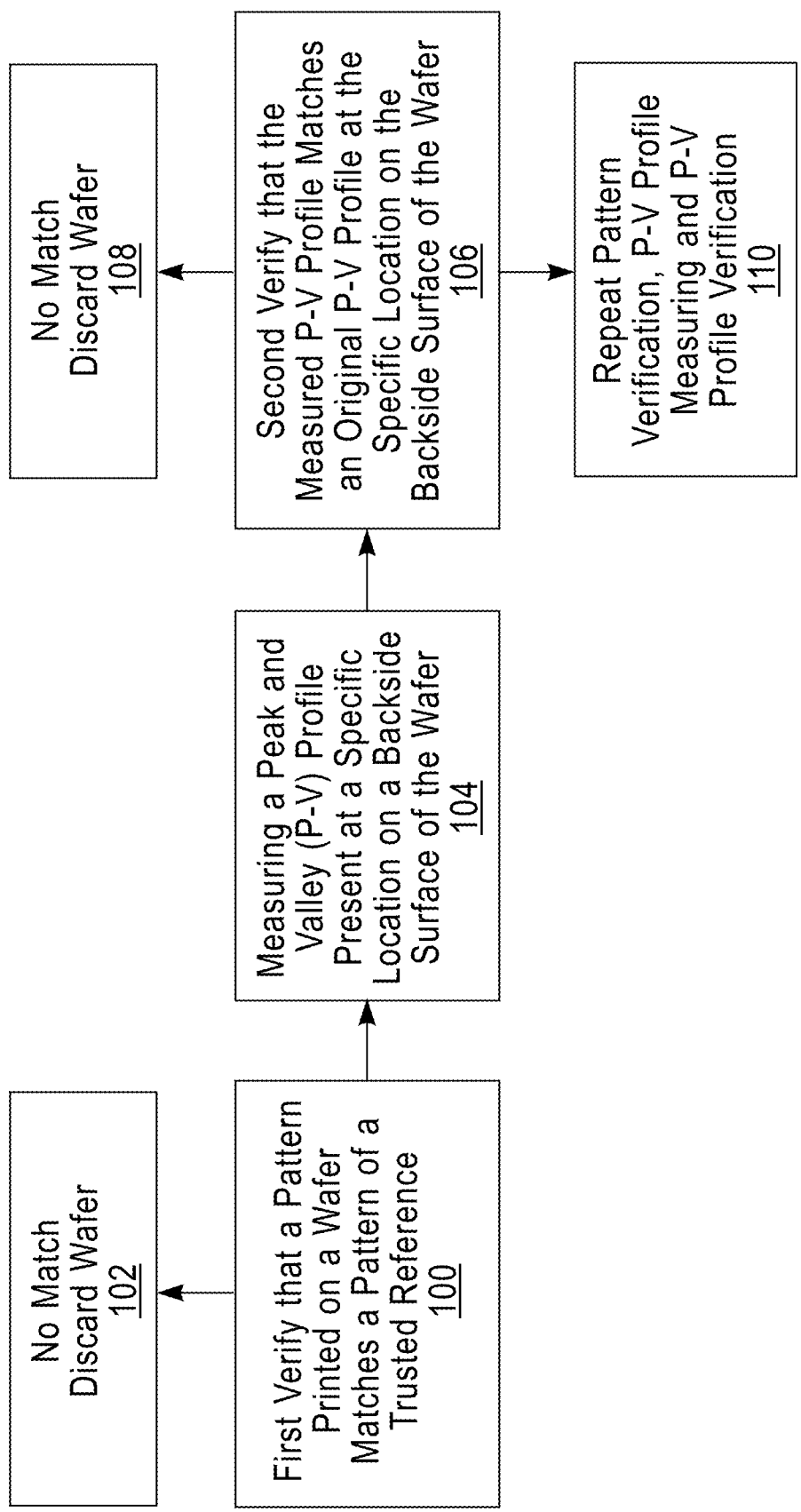
FIG. 1 is a flow diagram illustrating the basic processing steps of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As stated above, the present application provides an advanced security method for verifying that integrated circuit patterns being processed into one or more layers provided to a wafer are trusted patterns and that the wafer being used during processing is a trusted wafer. The method of the present application includes separate steps of pattern verification and wafer verification. After each pattern verification step, a wafer verification is performed, and the wafer verification is also performed at the end of the fabrication process when the wafer is delivered to an entity interested in having the wafer being trusted.

The term "wafer" is used throughout the present application to denote a semiconductor material that has semiconducting properties. Examples of semiconductor materials that can be used as the wafer include, but are not limited to, silicon (Si), a silicon germanium (SiGe) alloy, a silicon germanium carbide (SiGeC) alloy, germanium (Ge), a III/V compound semiconductor or a II/VI compound semiconductor. In one example, silicon is used as the wafer. In some embodiments, the wafer that is employed in the present application is a bulk semiconductor substrate or a semiconductor-on-insulator (SOI) substrate. By "bulk semiconductor substrate", it is meant a wafer that is entirely composed of at least one semiconductor material, as defined above. An SOI substrate includes a semiconductor material handle layer, an insulator layer and a topmost semiconductor material layer. When an SOI substrate is employed as the wafer, the semiconductor material handle layer serves as a backside portion of the wafer, while the topmost semiconductor layer serves as a front-side portion of the wafer wherein integrated circuits are subsequently manufactured.

Integrated circuits are formed on wafers utilizing techniques well known to those skilled in the art. So as to not obscure the method of the present application, the details regarding the integrated circuit fabrication are not provided herein. It is however noted that integrated circuit fabrication includes various deposition and patterning steps. The wafers containing the integrated circuits may be cut into many pieces, i.e., singulated, providing semiconductor die containing a given functional circuit.

Each integrated circuit that is formed on the wafer may include one or more field effect transistors and/or other semiconductor devices located in an active area of the wafer, a middle-of-the-line level containing contact structures embedded in a middle-of-the-line dielectric material, and a back-end-of-the-line (BEOL) structure including various interconnect dielectric material layers stacked one atop the other and containing various electrically conductive interconnect structures embedded therein. During fabrication of the integrated circuits, various deposition and lithography steps are used to form the elements of the integrated circuit. The lithographic steps include using masks that have trusted design patterns which are used to form the various elements of the integrated circuit.

Since much of the semiconductor manufacturing processing is done by an outside foundry, mask tampering and/or wafer tampering can be a problem. To ensure that the outside foundry is using the trusted design patterns and that the wafer being processed is a trusted wafer, the method of the present application, which is shown in FIG. 1, can be employed.

In one embodiment of the present application, and to avoid wafer tampering by the outside foundry, at least one natural physical unclonable feature is determined in a specific location (area) on the backside surface of the wafer(s). In some instances, the area containing the natural physical unclonable feature is 100 μm×100 μm. In some instances, multiple specific locations can be used. In this embodiment of the present application, the at least one natural physical unclonable feature is an original peak and valley profile of a pre-selected area of a non-modified backside surface of the wafer that can be measured utilizing a height measurement tool or an atomic force microscope. The original peak and valley profile of this embodiment of the present application is a unique fingerprint which would be difficult, if not impossible, for a foundry to reproduce. This natural physical unclonable feature, i.e., the original peak and valley profile at a specification location on the backside surface of the wafer, can be electronically stored in a secure computer database, and can be used anytime after a pattern verification step of the present (to be described in greater detail herein below) and after final wafer processing to ensure that the wafer has not be tampered with.

In another embodiment of the present application, and to avoid wafer tampering by the outside foundry, at least one intentionally added physical unclonable feature is formed in a specific location (area) on the backside surface of the wafer(s). In some instances, the area containing the intentionally added physical unclonable feature is 100 μm×100 μm. The at least one intentionally added physical unclonable feature can be formed by using a laser scribe that writes a random pattern that is not easily distinguishable from natural roughness of the wafer backside. Alternatively, a diamond tip scriber can also be used to form the at least one intentionally added physical unclonable feature. In this embodiment of the present application, the at least one intentionally added physical unclonable feature is an original peak and valley profile of a modified area of the backside surface that can be measured utilizing a height measurement tool or an atomic force microscope. The original peak and valley profile of this embodiment is also a unique fingerprint which would be difficult, if not impossible, for a foundry to reproduce. This physical unclonable feature, i.e., the original peak and valley profile, of this embodiment can be electronically stored in a secure computer database, and can be used anytime after a pattern verification step (to be described in greater detail herein below) and after final wafer process to ensure that the wafer has not be tampered with.

In yet another embodiment of the present application, and to avoid wafer tampering by the outside foundry, at least one natural physical unclonable feature, as defined above, and at least one intentionally added physical unclonable feature, as defined above can be used. It should be noted that for further wafer authentication more than one physical unclonable feature (i.e., more than one original peak and valley profiles) can be used in the present application.

Reference is made to the processing step shown in FIG. 1 which illustrate the method of the present application; the method requires that a natural physical unclonable feature, as defined above, and/or at least one intentionally added physical unclonable feature, as defined above, is(are) present on the backside surface of the wafer being used and that the original peak and valley profile of the physical unclonable feature has been measured and is electronically stored in a secure computer database. That is, the method begins by using a trusted wafer. The method is also performed during fabrication of integrated circuits on the wafer including the physical unclonable feature(s).

The method begins with a step 100 which includes first verifying that a pattern printed on the wafer matches a pattern of a trusted reference. In one embodiment, the trusted reference is a design pattern. In another embodiment, the trusted reference is a trusted reference wafer containing a desired print pattern. The printed pattern, which is located in a specific area of the wafer, is a pattern formed by the foundry. The design pattern is a trusted design pattern provided by a trusted lithographic mask and the design pattern is electronically stored in a secure computer database. The trusted reference wafer is a non-tampered reference wafer that contains the desired print pattern thereon. The image of the trusted wafer is electronically stored in a secure database. In one embodiment of the present application, the printed pattern to be verified is located in one layer of an integrated circuit. In another embodiment, the printed pattern to be verified is located in more than one layer of an integrated circuit. In either embodiment, the printed pattern may be one or more transistors, MOL contact structures, or electrically conductive interconnect structures.

The first verifying step of the present application includes obtaining an image of the pattern printed on the wafer and comparing the image to the trusted reference. Imaging may be performed at various wavelengths including, for example, X-ray, visible, and infrared. In one embodiment of the present application, imaging may include using an optical defect inspection tool, an optical microscope, a scanning electron microscope, or an e-Beam defect inspection apparatus. The image that is obtained can be electronically stored and compared with an image of the trusted reference that is also electronically stored in a secure computer database. The comparing may be performed manually or by utilizing a computer program that is designed to compare one image to another image.

If the printed pattern does not match the trusted reference, the processed wafer can be discarded as shown in step 102. If the printed pattern matches the trusted reference, then, in step 104, the peak and valley profile present at a specific location on a backside surface of the wafer is measured. In some embodiments, step 104 may include measuring the peak and valley profile at more than one location on the backside surface of the wafer. The peak and value profile that is measured in step 104 of the present application is at the same location as the original peak and valley profile (i.e., at the area including the aforementioned physical unclonable function).

The measured peak and valley profile is obtained utilizing a same measurement technique (i.e., a height measurement tool or an atomic force microscope) as the original peak and valley profile of the physical unclonable feature. The measured peak and valley profile obtained in step 104 of the present application can be electrically stored in a computer.

The method further includes, in step 106, second verify that the measured peak and valley profile matches an original peak and valley profile measured at the same location on the backside surface of the wafer. Step 106 includes comparing relative locations of the peaks and valleys of the measured peak and valley profile to the relative locations of the peaks and valleys, respectively, of the original peak and valley profile. The comparing of the relative locations of the peaks and valleys of the measured peak and valley profile to the relative locations of the peaks and valleys, respectively, of the original peak and valley profile may be performed manually or by utilizing a computer program that is designed to do such a comparison.

If the measured peak and valley profile does not match the original peak and valley profile, the wafer can be discarded as shown in step 108 of FIG. 1. If the measured peak and valley profile matches the original peak and valley profile, the wafer is the trusted wafer and further processing can be performed.

In some embodiments, as shown in step 110 of FIG. 1, additional steps of pattern verification of other patterns printed in other layers provided to the wafer, measuring the peak and valley profile at the specific location on the backside surface of the wafer, and verify that the measured peak and valley profile matches the original peak and valley profile can be performed. The additional steps are basically the same as described above for steps 100, 104 and 106 of the present application. The additional steps require the use of other trusted references (i.e., design patterns or trusted reference wafers containing a desired print pattern). The processed wafer can be discarded as described in steps 102 and 108 for these additional steps 110 if either pattern verification or peak and valley profile verification are not confirmed as positive. It is noted that after final processing, the wafer verification test, as described in steps 104 and 106, should be performed to verify that the final processed wafer is the trusted wafer.

The above described method of the present application can be easily integrated and automated into an existing foundry's fabrication line and provides a means for security within the foundry fabrication line.

Figure 2B:
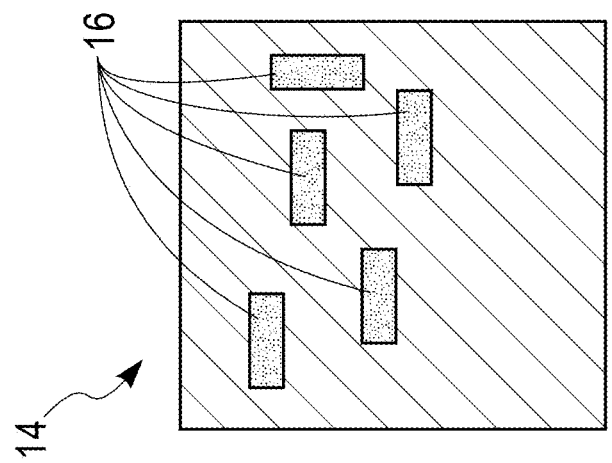
FIG. 2B is an illustration of a wafer that has printed patterns located in one layer provided to the wafer.
Figure 2A:
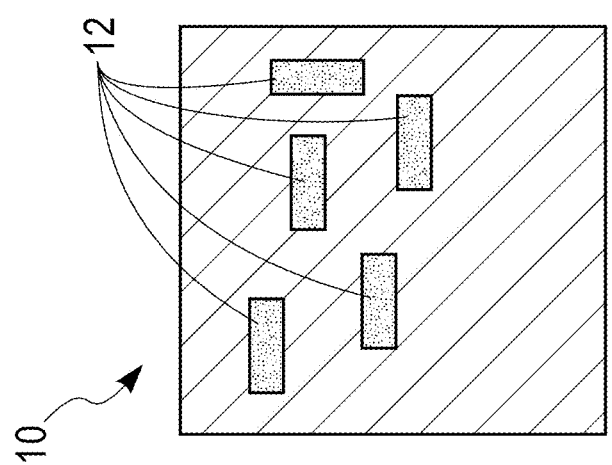
FIG. 2A is an illustration of a design pattern that can be used in one embodiment of the present application.

Reference is made to FIGS. 2A and 2B which illustrate one example of pattern verification using step 100 of the present application. Notably, and by way of one example, FIG. 2A illustrates a design pattern 10 that includes trusted patterns 12 located thereon, while FIG. 2B illustrates a wafer 14 that has printed patterns 16 located in one layer provided to the wafer. The design pattern 10 is electronically stored in a secure computer database, and that pattern can be compared to the printed pattern shown in FIG. 2B. In this case, the printed patterns 16 match the trusted patterns of the design pattern so a positive verification can be assessed and the method of the present application can continue to steps 104 and 106. It is also noted the design pattern 10 can also be a reference pattern that is printed using trusted sources (i.e., a trusted reference wafer).

Reference is made to FIGS. 3A, 3B and 3C which illustrate another example of pattern verification using step 100 of the present application. Notably, and by way of one example, FIG. 3A illustrates a design pattern 20 that includes trusted patterns 21, 22 located thereon. The trusted patterns 21 are located in a layer beneath the layer containing trusted patterns 22. FIG. 3B is a simulated image 26 using the design data shown in FIG. 3A. The simulated image includes patterns 27, 28 in which patterns 27 are located in a layer beneath a layer including patterns 28. The simulation tools can predict the image or pixel of the image intensity and/or color based on what film is on top of the bottom patterns 27 and overlay that with the patterns 28. The design pattern 20 and the simulated image 26 can be electronically stored in a secure computer database, and the pattern of the simulated image 26 can be compared to the printed pattern shown in FIG. 3C; in FIG. 3C element 14 is a wafer including printed patterns 31 and 32 in which printed patterns 31 are located in a layer beneath a layer containing printed patterns 32. In this case, the printed patterns 31, 32 match the trusted patterns of the design pattern so a positive verification can be assessed and the method of the present application can continue to steps 104 and 106. It is noted that more than two layered patterns can exits for the comparison between the simulated design pattern and patterns printed on the wafer. It is also noted the design pattern 10 can also be a reference pattern that is obtained from a wafer printed using trusted sources that contains multiple layers of pattern (i.e., a trusted reference wafer).

Figure 4:
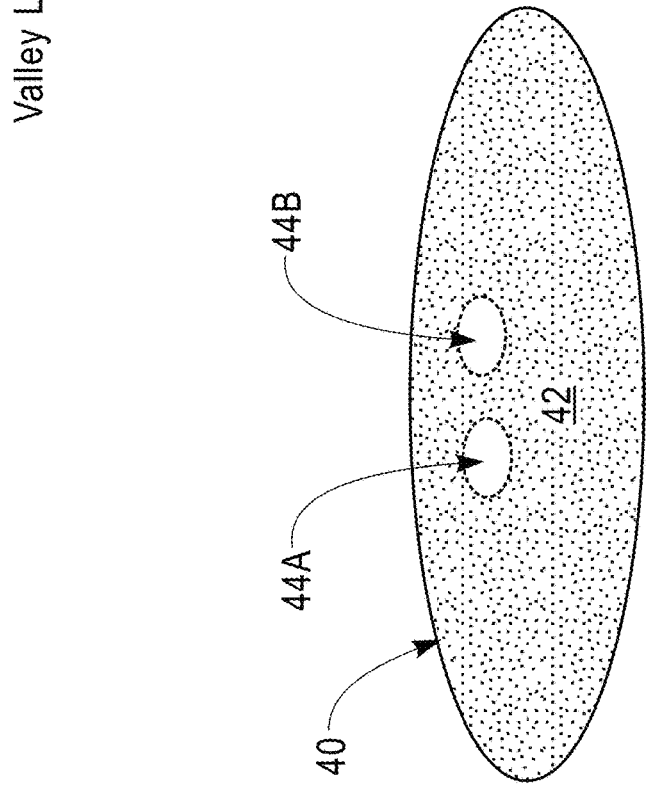
FIG. 4 is an illustration of a backside surface of a wafer including two physical unclonable functions located in defined areas in which original peak and valley profile measurements can be made and thereafter used to verify that the wafer is a trusted wafer.

Reference is now made to FIG. 4, which is an illustration of a backside surface 42 of a wafer 40 (prior to integrated circuit fabrication) including two physical unclonable functions 44A, 44B located in defined areas in which original peak and valley profiles can be determined and thereafter used to verify that the processed wafer is a trusted wafer during integrated circuit fabrication on wafer 40. Integrated circuit fabrication would occur on a front-side surface of wafer 40 that is opposite the backside surface 42 of wafer 40.

Figure 5A:
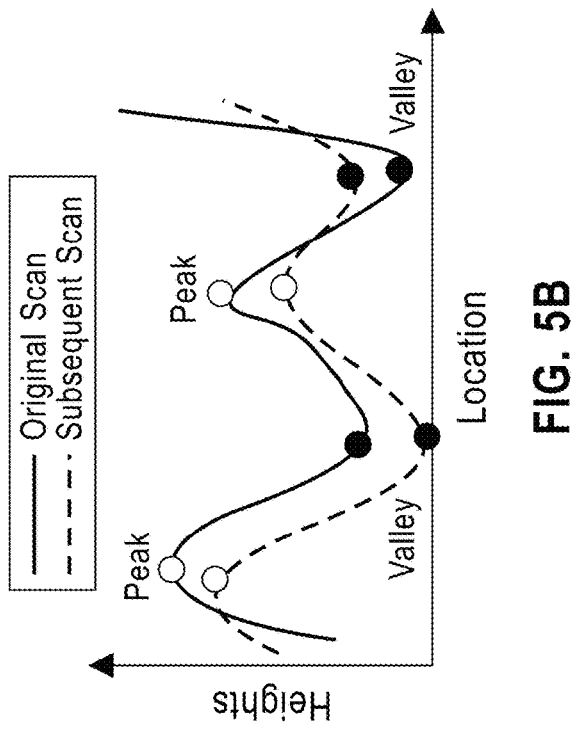
FIG. 5A is a three-dimensional (3D) graph showing a typical peak and valley profile that can be measured at a specific location on a backside surface of a wafer.
Figure 5B:
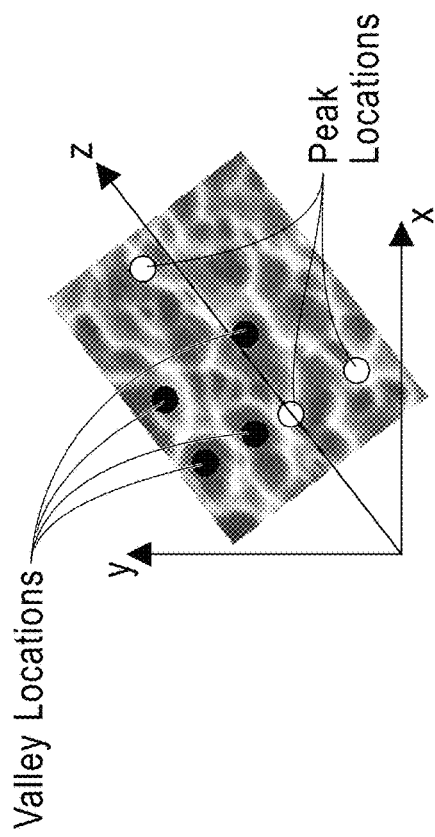
FIG. 5B is a graph height vs. location of the peaks and valleys for an original peak and valley profile located at a specific location of a backside surface of a wafer and a measured peaked and valley profile located at the same specific location of the backside surface of the wafer.

Referring now to FIG. 5A, there is illustrated a three-dimensional (3D) graph showing a typically peak and valley profile that can be measured at a specific location on a backside surface of a wafer. The peak and valley profile can be measured using one of the techniques mentioned above. FIG. 5B is a graph height vs. location of the peaks and valleys for an original peak and valley profile (solid line and labeled as original scan) located at a specific location of a backside surface of a wafer and a measured peaked and valley profile (dashed line and labeled as subsequent scan) located at the same specific location of the backside surface of the wafer. In the example illustrated in FIG. 5B, the measured peak and valley profile matches the original peak and valley profile indicating that the processed wafer is the trusted wafer. During the fabrication process, some changes in the area containing the physical unclonable feature may occurs from an intentional backside etch, or scratches from handling. By using multiple locations and multiple peak and valley profiles and allowing for some error due to above mentioned cases, one can still confirm the wafer identity. For example, one can allow the location of the peaks and valleys to vary by a specific amount such as, for example, 1 μm to 5 μm. One can also allow some matches to be less than 100% such as, for example, one could allow 70-90% matches of locations of peaks and valleys.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
   first verifying that a pattern printed on a processed wafer matches a pattern of a trusted reference;
   measuring, after the first verifying, a peak and valley profile present at a specific location on a backside surface of the processed wafer containing the patterned pattern; and
   second verify that the measured peak and valley profile of the processed wafer matches an original peak and valley profile measured at the same location on the backside surface of a trusted wafer, wherein when the measured peak and valley profiles of the processed wafer and the trusted wafer match, the processed wafer is the trusted wafer.

2. The method of claim 1, wherein the printed pattern is located in one layer of an integrated circuit.

3. The method of claim 1, wherein the printed pattern is located in more than one layer of an integrated circuit.

4. The method of claim 1, wherein the first verifying comprises obtaining an image of the pattern printed on the processed wafer and comparing the image to an image of the trusted reference.

5. The method of claim 4, wherein the obtaining of the image comprises using a optical defect inspection tool, an optical microscope, a scanning electron microscope, or an e-Beam defect inspection apparatus.

6. The method of claim 4, wherein the comparing comprises utilizing a computer program.

7. The method of claim 1, wherein an image of the trusted reference is electronically stored in a secure computer database.

8. The method of claim 1 wherein the measured peak and valley profile of the processed wafer is electronically stored in a secure computer database.

9. The method of claim 1, wherein the original peak and valley profile of the trusted wafer is electronically stored in a secure computer database.

10. The method of claim 1, wherein the measuring of the peak and valley profile comprises utilizing a height measurement tool.

11. The method of claim 1, wherein the measuring of the peak and valley profile comprises utilizing an atomic force microscope.

12. The method of claim 1, wherein the original peak and valley profile and the measured peak and valley profile are obtained utilizing a same measurement technique.

13. The method of claim 12, wherein the same measurement technique comprises utilizing one of a height measurement tool or an atomic force microscope.

14. The method of claim 1, wherein the second verifying comprises comparing relative locations of the peaks and valleys of the measured peak and valley profile of the processed wafer to relative locations of the peaks and valleys, respectively, of the original peak and valley profile of the trusted wafer.

15. The method of claim 1, further comprising additional steps of pattern verification of other patterns printed on the processed wafer, measuring the peak and valley profile at the specific location on the backside surface of the processed wafer, and verifying that the measured peak and valley profile of the processed wafer matches the original peak and valley profile of the trusted wafer.

16. The method of claim 1, wherein the processed wafer is discarded if the pattern printed on the processed wafer does not match the pattern of the trusted reference.

17. The method of claim 1, wherein the processed wafer is discarded if the measured peak and valley profile of the processed wafer does not match the original peak and valley profile of the trusted wafer.

18. The method of claim 1, wherein the trusted reference is a design pattern.

19. The method of claim 1, wherein the trusted reference is a trusted reference wafer.

* * * * *